United States Patent
Yonekura et al.

(10) Patent No.: US 7,340,121 B2
(45) Date of Patent: Mar. 4, 2008

(54) OPTOELECTRIC COMPOSITE SUBSTRATE AND METHOD OF MANUFACTURING THE SAME

(75) Inventors: Hideki Yonekura, Nagano (JP); Tadashi Kodaira, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 431 days.

(21) Appl. No.: 11/061,633

(22) Filed: Feb. 22, 2005

(65) Prior Publication Data

US 2005/0190808 A1    Sep. 1, 2005

(30) Foreign Application Priority Data

Feb. 26, 2004   (JP)   .............................. 2004-051001

(51) Int. Cl.
  *G02B 6/132*   (2006.01)
  *H01L 29/04*   (2006.01)
(52) U.S. Cl. ..................... 385/14; 65/386; 257/506; 257/523
(58) Field of Classification Search .................. 385/14; 65/386; 257/506, 523
See application file for complete search history.

(56) References Cited

U.S. PATENT DOCUMENTS 6,438,281 B1 *   8/2002   Tsukamoto et al. ........... 385/14

FOREIGN PATENT DOCUMENTS

JP   2003-287637   10/2003

* cited by examiner

*Primary Examiner*—Michelle Connelly-Cushwa
*Assistant Examiner*—Jerry T Rahll
(74) *Attorney, Agent, or Firm*—Kratz, Quintos & Hanson, LLP

(57) ABSTRACT

An optoelectric composite substrate of the present invention includes an insulating film, an optical waveguide embedded in the insulating film in a state that an upper surface is exposed from the insulating film, a via hole formed to pass through the insulating film, a conductor formed in the via hole, and a connection terminal on which an optical device is mounted and which is connected to an upper end side of the conductor, wherein the connection terminal is embedded in an upper-side portion of the via hole or is projected from the insulating film.

8 Claims, 18 Drawing Sheets

OPTOELECTRIC COMPOSITE SUBSTRATE AND METHOD OF MANUFACTURING THE SAME

CROSS-REFERENCE TO RELATED APPLICATIONS

This application is based on and claims priority of Japanese Patent Application No. 2004-51001 filed on Feb. 26, 2004, the entire contents of which are incorporated herein by reference.

BACKGROUND OF THE INVENTION

1. Field of the Invention

The present invention relates to an optoelectric composite substrate and a method of manufacturing the same and, more particularly, an optoelectric composite substrate constructed to have electric signal wirings and light signal waveguides and a method of manufacturing the same.

2. Description of the Related Art

Recently it is the electric wirings in the information terminal that are forming a bottleneck while the provision of trunk communication lines is making steadily progress mainly based on the optical fiber communication technology. In order to pass the limit of the transfer rate of the electric signal, the optoelectric composite substrate of the type that the signal transmission in the high-speed area is executed by the light signal has been proposed against such background, in place of the conventional electric circuit substrate in which all signal transmissions are executed by the electric signal.

As shown in FIG. 1, in the optoelectric composite substrate in the prior art, an optical waveguide 106 having such a configuration that a core portion 102 is surrounded by a cladding portion 104 is pasted onto a lower circuit board 100 by an adhesive layer 108. Also, an upper circuit board 200 is pasted onto the optical waveguide 106 by a transparent adhesive layer 108a. Connection pads 202 to which the optical device is connected electrically are provided to predetermined portions of the upper circuit board 200. The optical waveguide 106 is provided to extend in the direction perpendicular to a sheet of the drawing of FIG. 1.

Also, through holes 300 are provided in portions of the upper circuit board 200, the cladding portion 104, and the lower circuit board 100 under the connection pads 202 respectively.

A through hole conductive film 302 is formed on inner surfaces of the through holes 300, and a resin body 304 is filled in the through holes 300. The through hole conductive film 302 is connected to the connection pad 202 on the upper circuit board 200 and also is connected to a wiring layer (not shown) built in the lower circuit board 100.

Also, an opening portion 200a is provided in a portion of the upper circuit board 200 over an area that contains the core portion 102 of the optical waveguide 106. In addition, terminals of an optical device 400 are connected electrically to the connection pads 202 of the upper circuit board 200. The optical device 400 (e.g., light emitting element) is driven by the electric signal that is supplied from the lower circuit board 100 via the through hole conductive film 302, and then a light emitted from its light emitting surface (lower surface) is incident on a light incident portion A of the optical waveguide 106 via the opening portion 200a of the upper circuit board 200. Then, light signal incident upon the core portion 102 is propagated by repeating a total reflection, then input into a photodetector arranged on the other end of the optical waveguide 106, and then converted to the electric signal once again.

The optoelectric composite substrate similar to such configuration is set forth in Patent Literature 1 (Patent Application Publication (KOKAI) 2003-287637), for example.

In the meanwhile, in order to get the good optical coupling characteristic between the optical device 400 and the optical waveguide 106, first it is requested that a discrepancy between the light emitting portion of the optical device 400 and the light incident portion A of the optical waveguide 106 in the x-y directions (the horizontal direction in FIG. 1) is made small. In other words, it is extremely important that the light emitted from the optical device 400 is incident on the light incident portion A of the optical waveguide 106 in alignment with its inner side without leakage to the outer side.

Also, second a distance between the optical device 400 and the optical waveguide 106 (the z direction in FIG. 1) constitutes an important factor. In other words, since a width of a luminous flux incident upon the light incident portion A is expanded wider as a distance between the light emitting surface (lower surface) of the optical device 400 and the optical waveguide 106 is extended longer, an area of the light incident portion A must be set larger with the increase of the distance than it is needed. Since there is a limit to the area of the light incident portion A of the optical waveguide 106, it is extremely important that the distance between the optical device 400 and the optical waveguide 106 is set short.

For example, as shown in FIG. 2, in case a radiation angle θ of the light from the optical device 400 is set to 23 and an area of the light incident portion A of the optical waveguide 106 is set to 35×35 $\mu m^2$, a distance d between the optical device 400 and the optical waveguide 106 is given as 87.5 μm when a width w of the luminous flux of the optical device 400 is equal to the light incident portion A of the optical waveguide 106. In this case, the case where no positional discrepancy between the light emitting portion of the optical device 400 and the light incident portion A of the optical waveguide 106 in the x-y directions is present is illustrated in FIG. 2.

In addition, as shown in FIG. 3, if the distance d between the optical device 400 and the optical waveguide 106 is set shorter than that in FIG. 2, the width w of the luminous flux incident upon the light incident portion A is narrowed and thus the light is incident on the inner side of the light incident portion A. Therefore, a tolerance of the displacement in the x-y directions can be set large.

As described above, it is understood that, if the distance d between the optical device 400 and the optical waveguide 106 is set short, not only the area of the light incident portion A of the optical waveguide 106 can be reduced but also the tolerance of the displacement in the x-y directions can be set large.

In the above prior art, since the upper circuit board 200 having the connection pads 202 thereon and the optical waveguide 106 are pasted together via the adhesive layer 108a, a precise alignment between the connection pads 202 on which the optical device 400 is mounted and the light incident portion A of the optical waveguide 106 is difficult and thus it is difficult to set a mutual positional relationship. As a result, it is supposed that the positional discrepancy between the light from the optical device 400 and the light incident portion A of the optical waveguide 106 in the x-y directions is ready to occur and thus the desired optical coupling characteristics cannot be obtained.

Further, since the optical device 400 is mounted on the upper circuit board 200, the optical device 400 is away from the optical waveguide 106 by thicknesses of the upper circuit board 200 having the connection pads 202 thereon and the adhesive layer 108a. Therefore, when the area of the light incident portion A of the optical waveguide 106 is reduced, the luminous flux from the light emitting element 400 is incident on the outside of the light incident portion A. As a result, there exists such a problem that the desired optical coupling characteristics cannot be obtained.

In above Patent Literature 1, no consideration is given to these problems.

SUMMARY OF THE INVENTION

It is an object of the present invention to provide an optoelectric composite substrate capable of reducing displacement between an optical device and an optical waveguide in the horizontal direction and capable of setting a distance between the optical device and the optical waveguide to the shortest one, and a method of manufacturing the same.

The present invention is concerned with an optoelectric composite substrate that comprises an insulating film; an optical waveguide embedded in the insulating film in a state that at least an upper surface is exposed from the insulating film; a via hole formed to pass through the insulating film; a conductor formed in the via hole; and a connection terminal on which an optical device is mounted and which is connected to an upper end side of the conductor.

In one preferred mode of the present invention, the connection terminals may be projected from the upper surface of the insulating film, or the connection terminals may be embedded in the upper-side portions of the via holes such that the upper surfaces of the connection terminals and the insulating film constitute the coplanar surface. Also, the optical waveguide may be projected from the upper surface of the insulating film, or the upper surfaces of the optical waveguide and the insulating film may constitute the coplanar surface. Then, the optical device is connected to the connection terminals in such a manner that the light emitting surface or the light detection surface of the optical device opposes to a predetermined portion of the optical waveguide.

For example, in case the upper surfaces of the optical waveguide and the insulating film are formed to constitute the coplanar surface and the connection terminals are formed to project from the upper surface of the insulating film at a predetermined height, a distance between the optical device and the optical waveguide can be adjusted only by a height of the connection terminals. Alternately, in case the upper surfaces of the connection terminals, the insulating film, and the optical waveguide are formed to constitute the coplanar surface, the distance between the optical device and the optical waveguide can be adjusted by a height of bumps provided to the optical device. Further, in case the optical waveguide is projected from the upper surface of the insulating film, the distance between the optical device and the optical waveguide can be adjusted by the height of the connection terminals (or the bumps of the optical device) and a projection height of the optical waveguide.

Therefore, the optical device can be arranged in close vicinity to the optical waveguide not to touch it and thus the optical coupling characteristics can be improved. Also, since the optical device can be positioned in close vicinity to the optical waveguide, there is not necessary to unnecessarily increase the area of the light incident portion of the optical waveguide. Therefore, the optoelectric composite substrate in the present invention can deal easily with the higher density of the optoelectric composite substrate. In addition, because the distance between the optical device and the optical waveguide can be reduced to the shortest one, the width of the luminous flux can be narrowed when the light is input into the light incident portion of the optical waveguide in the case where the optical device is the light emitting element, for example. Accordingly, since the light from the optical device can be incident on the inner side of the light incident portion of the optical waveguide, a tolerance of the positional discrepancy between the optical device and the light incident portion in the horizontal direction can be set large and thus a positional discrepancy precision in the production process can be relaxed.

Also, the present invention is concerned with a method of manufacturing an optoelectric composite substrate, which comprises the steps of forming an optical waveguide on a temporal substrate; forming an insulating film on the temporal substrate to cover the optical waveguide; forming a via hole to pass through the insulating film; forming sequentially a metal layer and a conductor in the via hole; and removing selectively the temporal substrate to expose surfaces of the metal layer, the optical waveguide, and the insulating film, whereby a connection terminal made of the metal layer is obtained.

In the present invention, first the optical waveguide is formed on the temporal substrate (e.g., the copper foil), and then the insulating film for covering the optical waveguide is formed. Then, the via holes each having a depth that reaches the temporal substrate are formed in the insulating film. Then, the metal layer and the conductor are formed in the via holes respectively, and then the temporal substrate is removed selectively. Therefore, the upper surfaces of the metal layers, the optical waveguide, and the insulating film are exposed and thus the connection terminals made of the metal layer are obtained.

When using such manufacturing method, the optoelectric composite substrate having the foregoing configuration can be easily manufactured. In the present invention, unlike the prior art, the connection terminals are not formed by pasting the substrates together but are formed on the same substrate by a series of productions processes in a state that such connection terminals are aligned with the light incident portion of the optical waveguide with high precision. According to this, the optical device that is mounted on the connection terminals is also mounted in registration with the light incident portion (or the light emission portion) of the optical waveguide.

As a result, unlike the prior art, there is no possibility that the light from the optical device is input into the outside of the light incident portion of the optical waveguide due to the positional discrepancy, and thus the good optical coupling characteristics can be obtained.

In the above inventions, in order to get the configuration that the connection terminals are projected from the upper surface of the insulating film at a predetermined height, the concave portions that are communicated with the via holes are formed on the temporal substrate when the via holes are formed, and then the metal layers are formed in the concave portions.

Also, in the above inventions, in order to get the configuration that the optical waveguide is projected from the upper surface of the insulating film, in the step of forming the optical waveguide on the temporal substrate, the recess portion that corresponds to a width of the optical waveguide is formed on the temporal substrate and then the optical waveguide is formed such that a part of the optical waveguide is fitted into the recess portion.

As described above, in the optoelectric composite substrate according to the present invention, the optical device can be arranged in close vicinity to the optical waveguide up to the limit and also the positional discrepancy can be reduced. Therefore, the good optical coupling characteristics can be obtained.

DETAILED DESCRIPTION OF THE PREFERRED EMBODIMENTS

Embodiments of the present invention will be explained with reference to the accompanying drawings hereinafter.

First Embodiment

FIGS. 4A to 4I are sectional views showing a method of manufacturing an optoelectric composite substrate according to a first embodiment of the present invention. FIG. 5 is a partial sectional view showing the situation that an optical device is mounted on the same optoelectric composite substrate.

Figure 1:
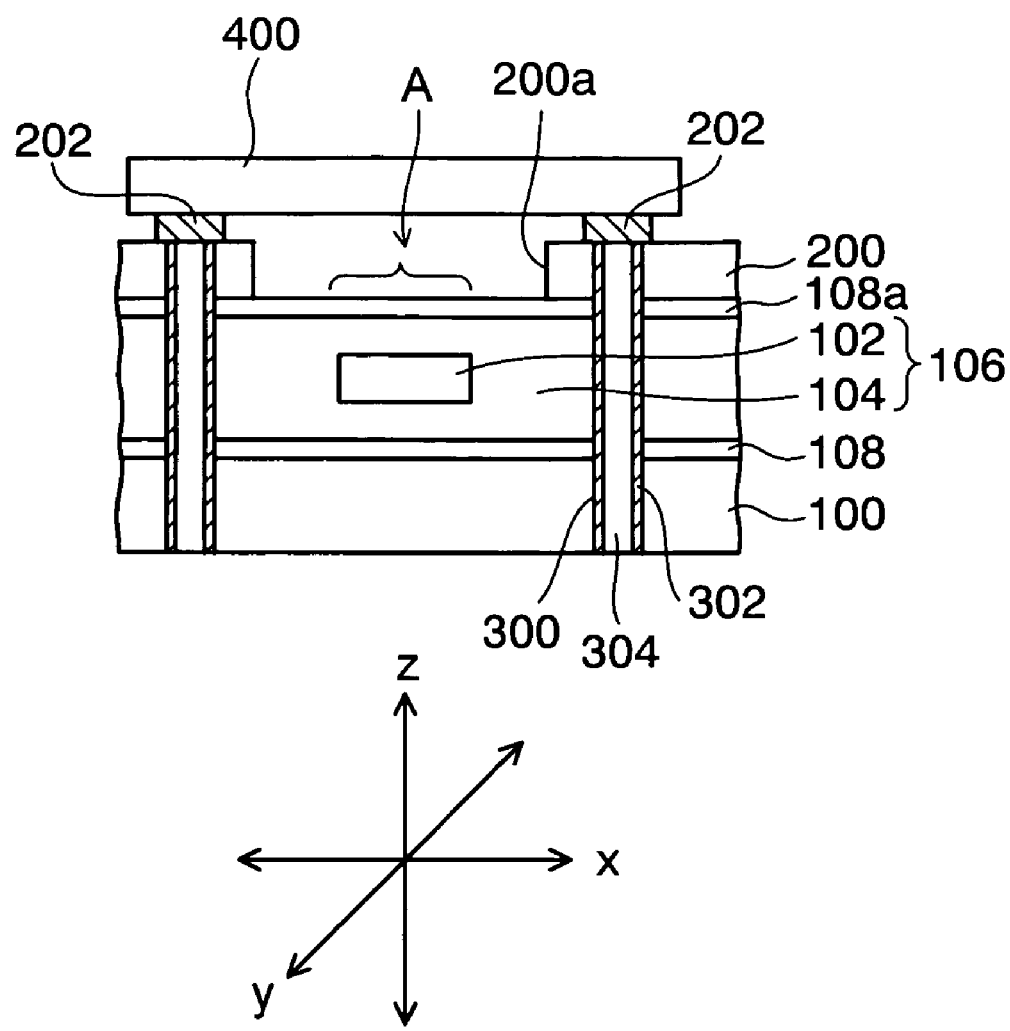
FIG. 1 is a sectional view showing a configuration of a part of an optoelectric composite substrate in the prior art.
Figure 2:
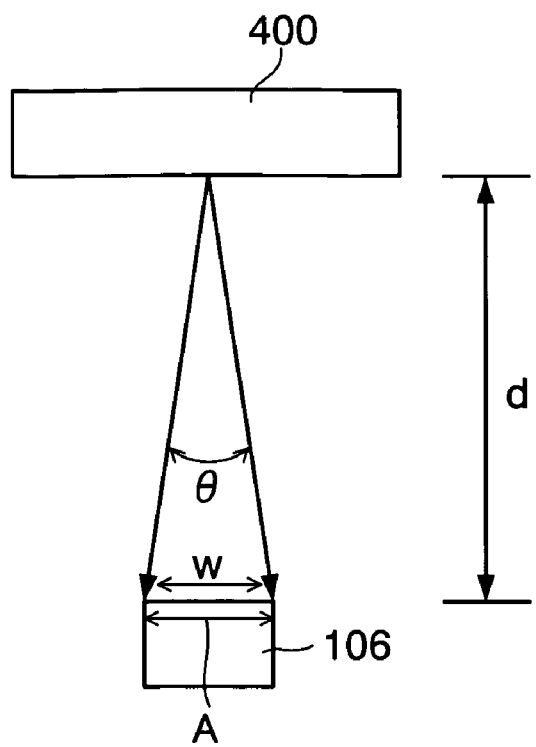
FIG. 2 is a sectional view (#1) showing such a behavior that a light emitted from a surface emitting laser is incident on an optical waveguide.
Figure 3:
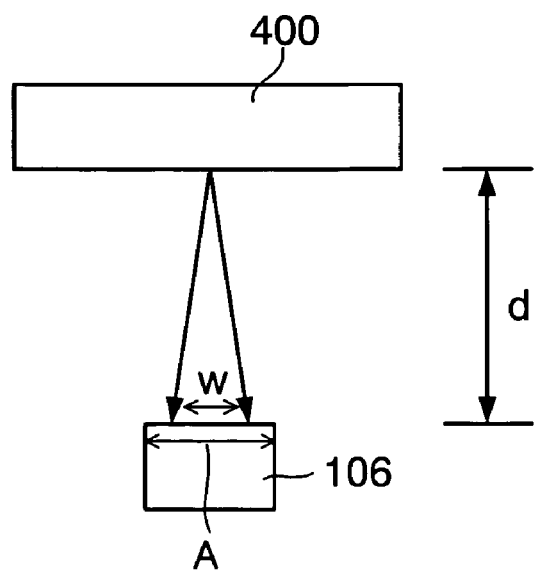
FIG. 3 is a sectional view (#2) showing such a behavior that the light emitted from the surface emitting laser is incident on the optical waveguide.
Figure 4A:
FIGS. 4A to 4I are partial sectional views showing a method of manufacturing an optoelectric composite substrate according to a first embodiment of the present invention.
Figure 4B:
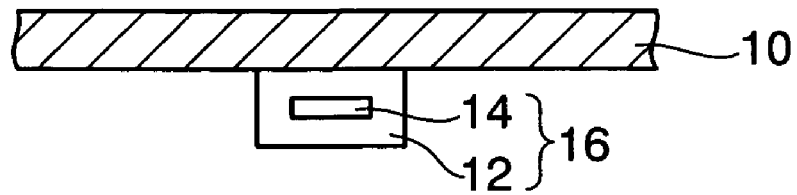
Figure 5:
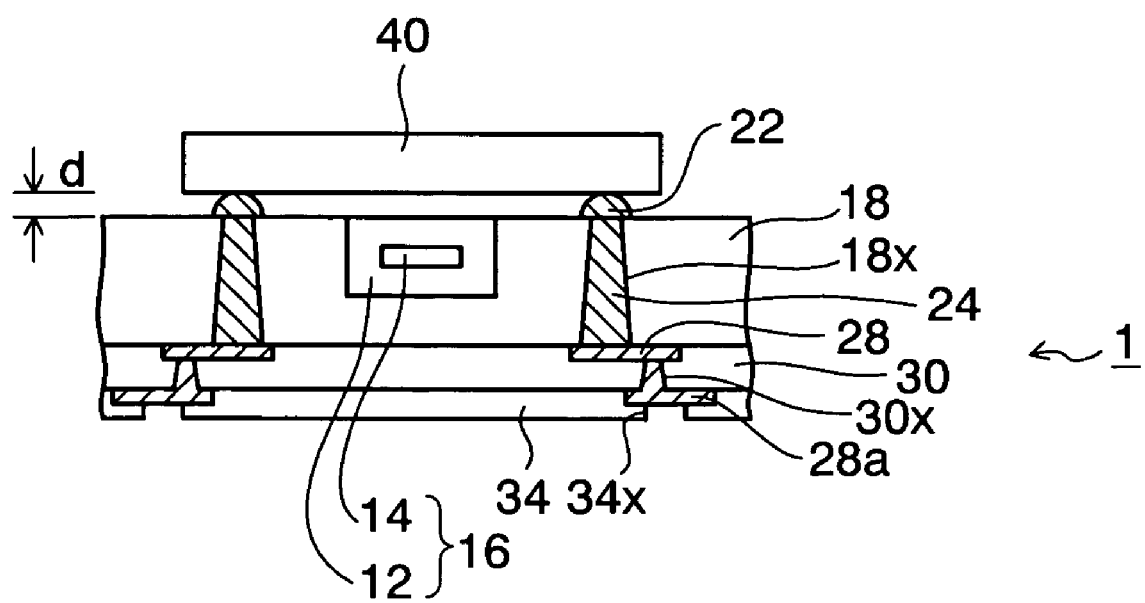
FIG. 5 is a partial sectional view showing the situation that an optical device is mounted on the optoelectric composite substrate according to the first embodiment of the present invention.

In the method of manufacturing the optoelectric composite substrate in the first embodiment of the present invention, as shown in FIG. 4A, first a copper foil 10 acting as a temporal substrate is prepared. Then, as shown in FIG. 4B, an optical waveguide 16 having such a structure that a core portion 14 is surrounded by a cladding portion 12 is formed on one side of the copper foil 10. A refractive index of the core portion 14 is set larger than a refractive index of the cladding portion 12. Where the term "on" used in the manufacturing method in the present embodiment denotes "on the lower surface" in the drawings in some cases.

Figure 6A:
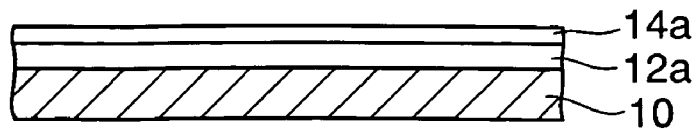
FIGS. 6A to 6E are partial sectional views showing a first example of a method of forming an optical waveguide according to the first embodiment of the present invention.
Figure 6B:
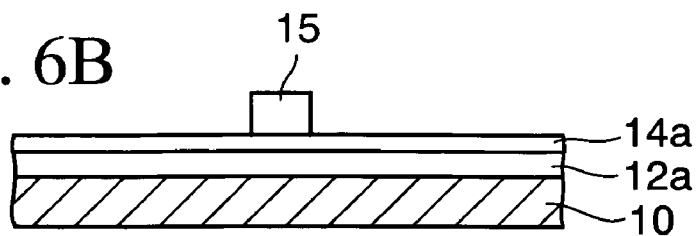
Figure 6C:
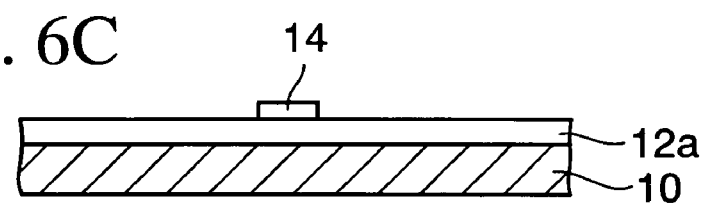

As a first example of a method of forming the optical waveguide 16, as shown in FIG. 6A, first a first cladding layer 12a is formed on the copper foil 10 and then a core layer 14a having a refractive index that is larger than the first cladding layer 12a is formed thereon. Then, as shown in FIG. 6B, a resist film 15 is patterned on the core layer 14a to form the core portion 14. Then, as shown in FIG. 6C, the core layer 14a is etched by RIE while using the resist film 15 as a mask and then the resist film 15 is removed. Thus, the core portion 14 is obtained.

Figure 6D:
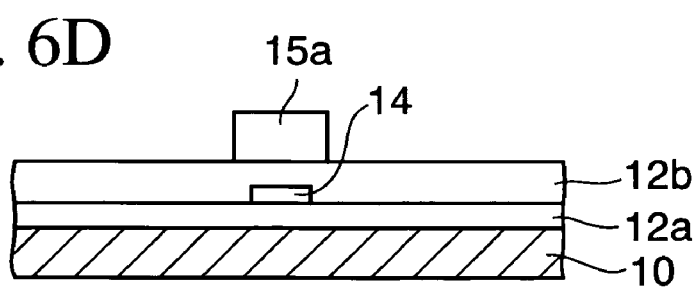
Figure 6E:
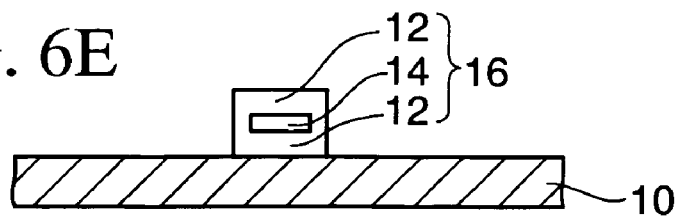

Then, as shown in FIG. 6D, a second cladding layer 12b made of the same material as the first cladding layer 12a is formed to cover the core portion 14, and then a resist film 15a is patterned on the second cladding layer 12b to get a desired optical waveguide 16. Then, as shown in FIG. 6E, the second cladding layer 12b and the first cladding layer 12a are etched by using the resist film 15a as a mask. Then, the resist film 15a is removed.

Thus, as shown in FIG. 6E, the optical waveguide 16 having such a structure that the core portion 14 is surrounded by the cladding layer 12 is obtained. As the material of the first and second cladding layers 12a, 12b and the core layer 14a, quartz glass, fluorinated polyimide, or UV cured epoxy resin is preferably used. As the forming method, the CVD method or the coating method is employed.

Figure 7A:
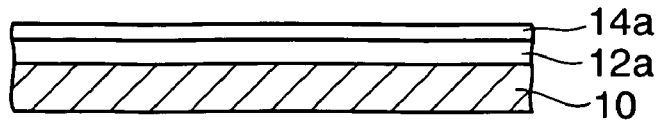
FIGS. 7A to 7E are partial sectional views showing a second example of the method of forming an optical waveguide according to the first embodiment of the present invention.
Figure 7B:
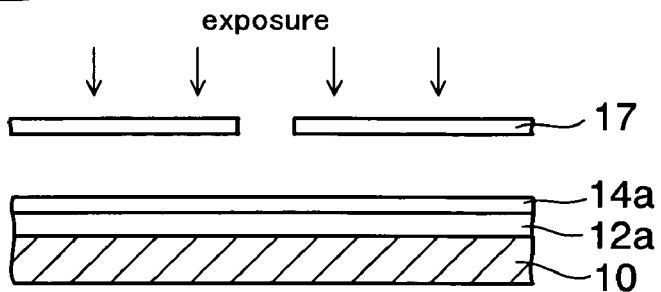
Figure 7C:
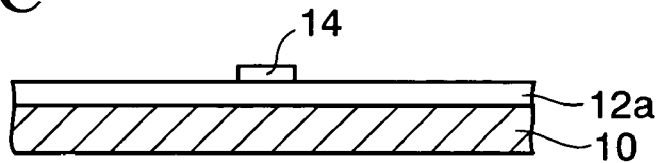

Also, as a second example of the method of forming the optical waveguide 16, as shown in FIG. 7A, first the first cladding layer 12a is formed on the copper foil 10 and then the core layer 14a made of photosensitive polyimide, or the like is formed thereon. Then, as shown in FIG. 7B, a portion of the core layer 14a serving as the core portion 14 is selectively exposed and developed via an exposure mask 17. Thus, as shown in FIG. 7C, the core layer 14a is patterned and the core layer 14a is formed on the first cladding layer 12a.

Figure 7D:
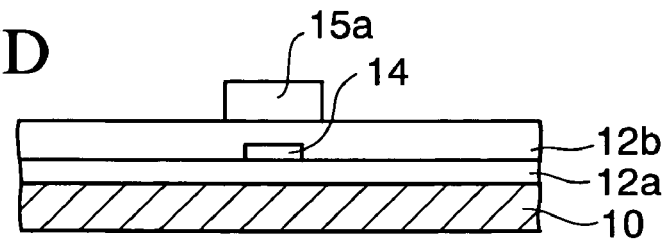
Figure 7E:
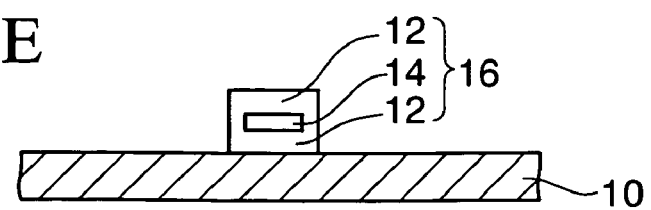

Then, as shown in FIG. 7D, like the first example, the second cladding layer 12b for covering the core portion 14 is formed, then the resist film 15a is patterned, and then the second cladding layer 12b and the first cladding layer 12a are etched by using the resist film 15a as a mask. Then, the resist film 15a is removed. Thus, as shown in FIG. 7E, the optical waveguide 16 having such a structure that the core portion 14 is surrounded by the cladding layer 12 is formed.

Figure 8A:
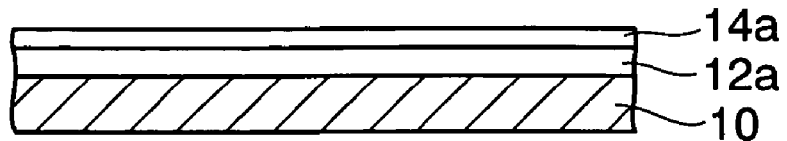
FIGS. 8A to 8D are partial sectional views showing a third example of the method of forming an optical waveguide according to the first embodiment of the present invention.
Figure 8B:
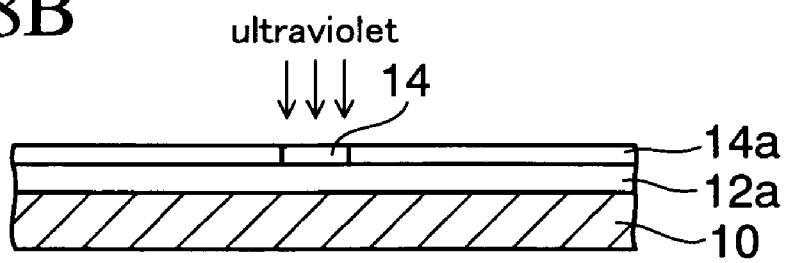

Alternately, as a third example of the method of forming the optical waveguide 16, as shown in FIG. 8A, first the first cladding layer 12a and the core layer 14a are formed on the copper foil 10 sequentially. In this third example, as the material of the core layer 14a, the material of made of polyimide resin, or the like, a refractive index of which is increased by the ultraviolet irradiation, is used. Then, as shown in FIG. 8B, the core portion 14 having a higher refractive index than the first cladding layer 12a is formed by irradiating selectively the ultraviolet rays to the portion of the core layer 14a, which will act as the core portion 14.

Figure 8C:
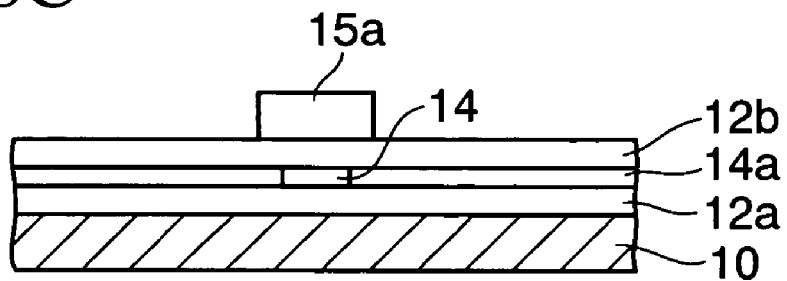
Figure 8D:
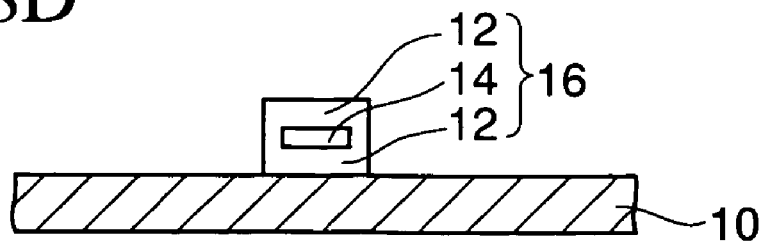

Then, as shown in FIG. 8C, the second cladding layer 12b for covering the core portion 14 is formed, and then the resist film 15a is patterned on the second cladding layer 12b. Then, areas of the second cladding layer 12b, the first cladding layer 12a, and the core layer 14a except the portion serving as the core portion 14 are etched by using the resist film 15a as a mask. Then, the resist film 15a is removed. Thus, as shown in FIG. 8D, the optical waveguide 16 having such a structure that the core portion 14 is surrounded by the cladding layer 12 is obtained.

Further, as a fourth example of a method of forming the optical waveguide 16, the member of the optical waveguide having such a structure that the core portion is surrounded by the cladding layer may be prepared, and then the member may be pasted onto the copper foil 10 via the adhesive layer.

Figure 4C:
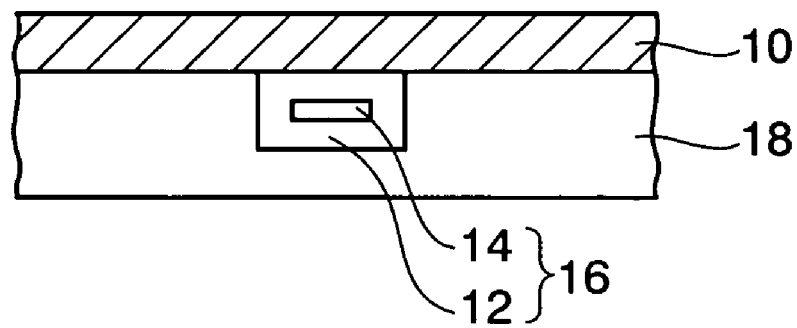

After the optical waveguide 16 is formed on one surface of the copper foil 10 as above, as shown in FIG. 4C, an insulating film 18 is formed on the copper foil 10 and the optical waveguide 16 by pasting a resin film made of epoxy resin, polyimide resin, or the like. As a result, the optical waveguide 16 is buried in the insulating film 18 and also an exposed surface of the insulating film 18 (a lower surface in FIG. 4C) is planarized.

Figure 4D:
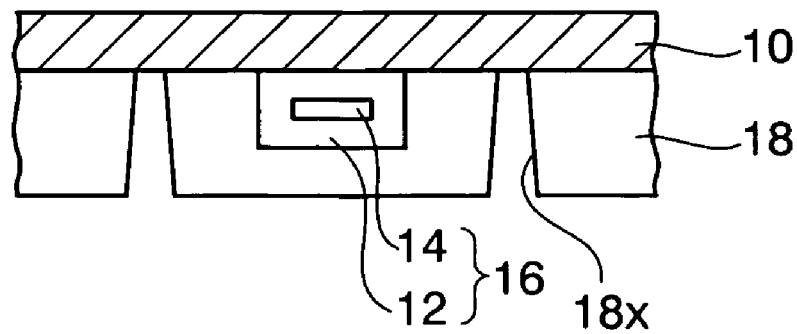
Figure 4E:
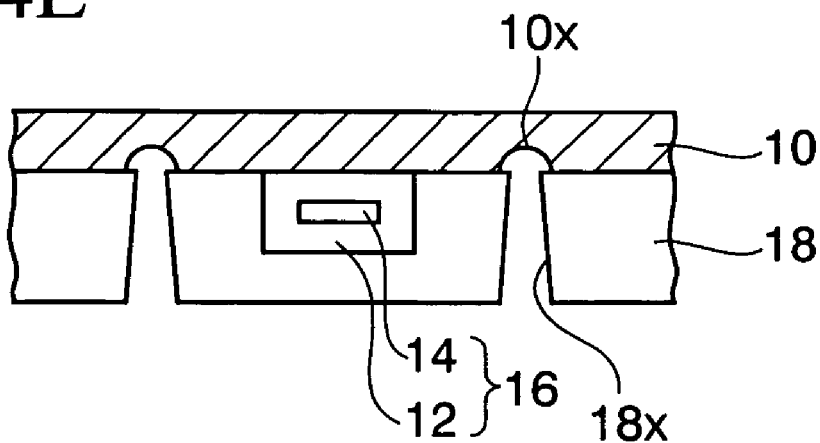

Then, as shown in FIG. 4D, first via holes 18x each having a depth that reaches the copper foil 10 are formed by processing predetermined portions of the insulating film 18 by the laser, or the like. At this time, the first via holes 18x are formed in such a manner that they are aligned with the light incident portions (or light emission portions) of the optical waveguide 16 with high precision. Then, as shown in FIG. 4E, concave portions 10x are formed by etching respective portions of the copper foil 10, which are exposed from bottom surfaces of the first via holes 18x. As the etching of the copper foil 10, the wet etching using iron (III) chloride aqueous solution, copper (II) chloride aqueous solution, ammonium peroxodisulfate aqueous solution, or the like is employed. Alternately, the means for anisotropically processing the copper foil 10 may be employed.

Figure 4F:
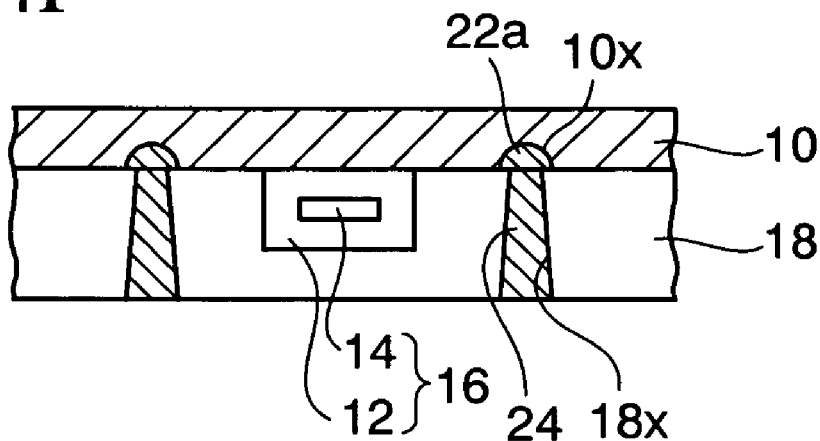

Then, as shown in FIG. 4F, metal layers 22a made of solder, gold, copper, or the like are formed in the concave portions 10x of the copper foil 10 by the electroplating utilizing the copper foil 10 as a plating power-feed layer. Then, a Cu film, or the like is filled in the first via holes 18x by the similar electroplating. Thus, conductors 24 connected to the metal layers 22a are formed.

In this case, the copper foil 10 is selectively released at the predetermined stage, as described later, and thus the exposed metal layers 22a constitute the connection terminals to which the optical device is connected. Since the first via holes 18x are formed in registration with predetermined portions of the optical waveguide 16, as described above, the metal layers 22a (connection terminals) are also formed in registration with the predetermined portions of the optical waveguide 16.

Next, a method of forming a build-up wiring layer connected to the conductors 24 will be explained hereunder.

Figure 4G:
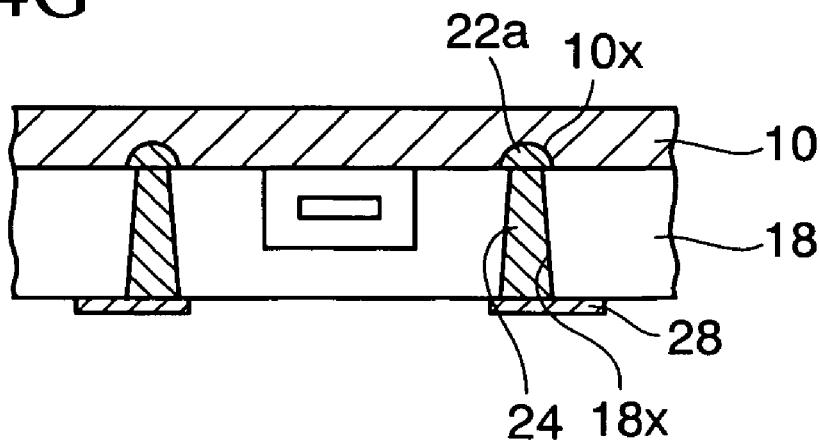

First, as shown in FIG. 4G, first wiring layers 28 connected to the conductors 24 are formed on (a lower surface of) the insulating film 18. The first wiring layers 28 are formed by the semi-additive process, for example. In more detail, a seed layer (not shown) is formed on the conductors 24 and the insulating film 18 by the electroless plating, or the like, and then a resist film (not shown) having openings portions that coincide with the first wiring layers 28 is formed on the seed layer. Then, a metal film (not shown) is formed in the openings portions in the resist film by electroplating the copper, or the like by means of the electroplating utilizing the seed layer as the plating power-feeding layer. Then, the resist film is removed, and then the seed layer is etched by using the metal film as a mask. Thus, the first wiring layers 28 are obtained. In addition to this, there are the subtractive process, the full additive process, and the like as the method of forming the first wiring layers 28.

Figure 4H:
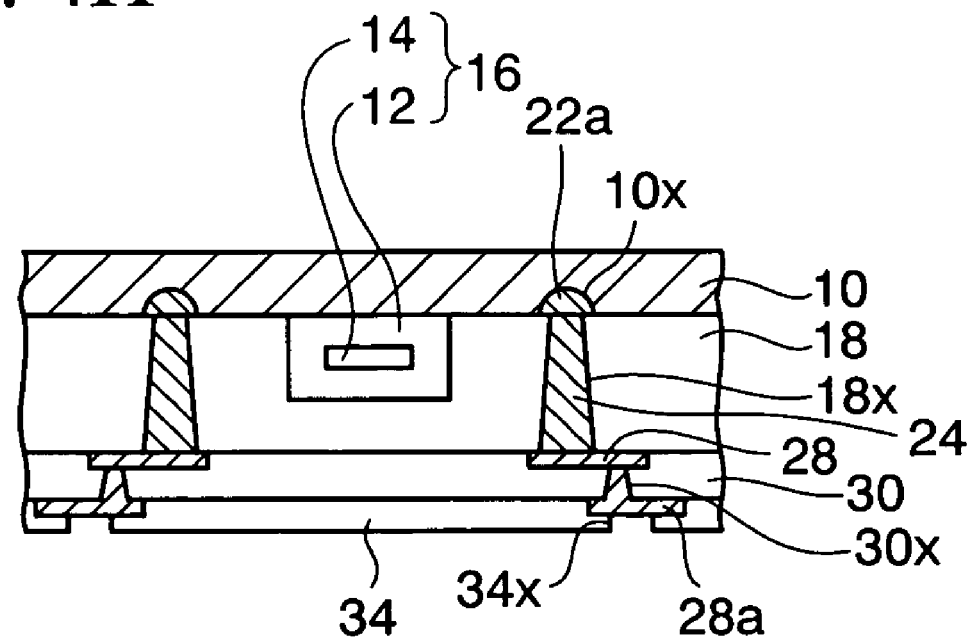

Then, as shown in FIG. 4H, an interlayer insulating film 30 for covering the first wiring layers 28 is formed by pasting a resin film such as epoxy resin, polyimide resin, or the like. Then, second via holes 30x are formed in portions of the interlayer insulating film 30 on the first wiring layers 28. Then, second wiring layers 28a connected to the first wiring layers 28 via the second via holes 30x are formed on the interlayer insulating film 30 by the similar method to the method of forming the first wiring layers 28. In the present embodiment, a mode in which two layers of build-up wiring layers 28, 28a are formed is exemplified, but another mode in which an n-layered (n is an integer that is 1 or more) wiring layer is formed may be employed. Then, a protection layer 34 such as the solder resist in which opening portions 34x are provided on the second wiring layers 28a is formed on the interlayer insulating film 30.

Figure 4I:
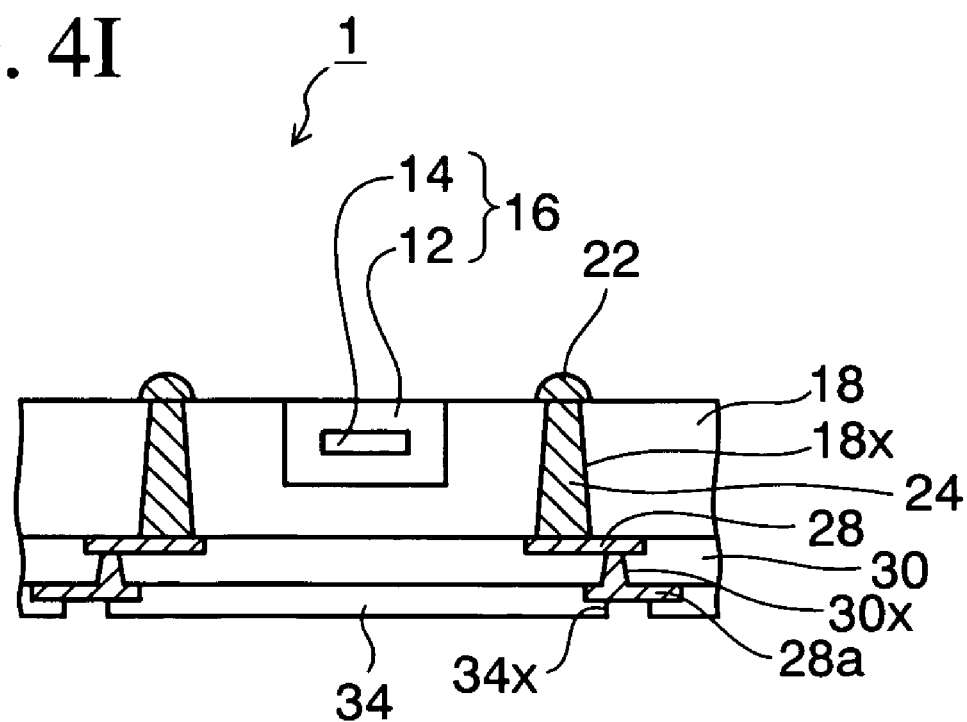

Then, the copper foil 10 is selectively removed from a resultant structure shown in FIG. 4H. Thus, as shown in FIG. 4I, upper surfaces of the optical waveguide 16, the insulating film 18, and the metal layers 22a are exposed. The metal layers 22a are formed to project from the upper surfaces of the insulating film 18 and the optical waveguide 16 at a predetermined height, and act as connection terminals 22 to which the optical device is connected later. In this case, the hemispherical connection terminal 22 (bumps) are illustrated in FIG. 4I, but quadrangular electrodes may be formed if the means for anisotropically processing the copper foil 10 is employed when the concave portions 10x are formed on the copper foil 10. Also, a height of the connection terminal 22 can be adjusted appropriately by adjusting the depth of the concave portion 10x formed on the copper foil 10.

In the present embodiment, since a distance between the light emitting surface of the optical device and the optical waveguide 16 is decided according to the height of the connection terminal 22, both elements can be arranged closely up to the limit and thus the optical coupling characteristics can be improved.

In the above mode, the copper foil 10 as the temporal substrate is released after the build-up wiring layer is formed, but such copper foil 10 can be released at any stage after the metal layers 22a and the conductors 24 are formed (after the steps in FIG. 4F). Also, a mode in which the copper foil 10 is used as the temporal substrate is exemplified, but any material may be employed if the material can be selectively removed from the metal layers 22a, the optical waveguide 16, and the insulating film 18, and thus various metal plates other than the copper foil 10 may be employed. If the metal plate is used, such metal plate is removed selectively by the wet etching.

With the above, an optoelectric composite substrate 1 in the first embodiment of the present invention is obtained. Then, as shown in FIG. 5, the connection electrodes of the optical device 40 are flip-chip connected to the connection terminals 22 of the optoelectric composite substrate 1. In the present embodiment, the light emitting element is mounted on one end side of the optical waveguide 16 as an optical device 40, and the photodetector is mounted on the other end side of the optical waveguide 16. In regarding to an applied example of the optoelectric composite substrate in the present embodiment, please see a second embodiment.

In the optoelectric composite substrate 1 in the present embodiment, as shown in FIG. 5, the optical waveguide 16 having such a structure that the core portion 14 is surrounded by the cladding layer 12 is embedded in the insulating film 18 to expose its upper surface. That is, preferably the upper surface of the optical waveguide 16 and the upper surface of the insulating film 18 constitute a coplanar surface. The optical waveguide 16 is provided to extend in the perpendicular direction to a sheet of FIG. 5. The first via holes 18x are formed in the insulating film 18 to pass therethrough, and the conductors 24 are filled in the first via holes 18x.

In addition, the connection terminals 22 are provided on the upper surfaces of the conductors 24, and the connection terminals 22 are projected from the upper surface of the insulating film 18 at a predetermined height. The connection electrodes of the optical device 40 are connected electrically to the connection terminals 22.

Also, the first wiring layers 28 connected to the conductors 24 are formed on the lower surface of the insulating film 18. Also, the interlayer insulating film 30 in which the second via holes 30x are formed on the first wiring layers 28 is formed on (the lower surface of) the insulating film 18 and the first wiring layers 28. The second wiring layers 28a connected to the first wiring layers 28 via the second via holes 30x are formed on (the lower surface of) the interlayer insulating film 30. The protection layer 34 in which the opening portions 34x are provided on the second wiring layers 28a is formed on the interlayer insulating film 30. The second wiring layers 28a exposed from the opening portions 34x function as the external connection terminals. Otherwise, terminals connected to the second wiring layers 28a may be employed as the external connection terminals.

In the optoelectric composite substrate 1 in the present embodiment, the connection terminals 22 are provided to project at a predetermined height from the upper surfaces of the insulating film 18 and the optical waveguide 16, which are formed as the coplanar surface, and then the optical device 40 (e.g., the light emitting element) is mounted on the connection terminals 22. That is, since the distance d between the light emitting surface (lower surface) of the optical device 40 and the optical waveguide 16 is decided only by the height of the connection terminals 22, the optical device 40 can be arranged in close vicinity to the optical waveguide 16 up to the limit and thus the optical coupling characteristics can be improved. Also, since the optical device 40 can be positioned in close vicinity to the optical waveguide 16 up to the limit, there is not necessary to unnecessarily increase the area of the light incident portion of the optical waveguide 16. Therefore, the optoelectric composite substrate 1 in the present embodiment can deal easily with the higher density of the optoelectric composite substrate.

In addition, because the distanced between the optical device 40 and the optical waveguide 16 can be reduced to the shortest one, the width of the luminous flux of the optical device 40 when the light is input into the light incident portion of the optical waveguide 16 can be narrowed. Accordingly, since the light from the optical device 40 can be incident on the inner side of the light incident portion of the optical waveguide 16, a tolerance of the positional discrepancy in the x-y directions can be set large and thus a positional discrepancy precision in the production process can be relaxed.

Further, unlike the prior art, the connection terminals 22 are not formed by pasting the substrates together but formed on the same substrate by a series of productions processes in a state that such connection terminals are aligned with the light incident portion of the optical waveguide 16 with high precision. According to this, the optical device 40 that is mounted on the connection terminals 22 is also mounted in registration with the light incident portion of the optical waveguide 16.

As a result, there is no possibility that the light from the optical device 40 is input into the outside of the light incident portion of the optical waveguide 16 due to the positional discrepancy, and thus the good optical coupling characteristics can be obtained. In this case, the similar advantages can be achieved even when the optical device 40 is used as the photodetector.

Second Embodiment

FIGS. 9A to 9I are sectional views showing a method of manufacturing an optoelectric composite substrate according to a second embodiment of the present invention. FIG. 10 is a partial sectional view showing the situation that an optical device is mounted on the same optoelectric composite substrate. The feature of the second embodiment resides in that, since the upper surface of the optical waveguide is formed to project from the upper surface of the insulating film, a distance between the optical device and the optical waveguide is adjusted by a height of the connection terminals and a projection height of the optical waveguide. In FIGS. 9A to 9I, explanation of the same steps as those in the first embodiment will be omitted herein.

Figure 9A:
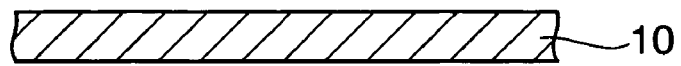
FIGS. 9A to 9I are partial sectional views showing a method of manufacturing an optoelectric composite substrate according to a second embodiment of the present invention.
Figure 9B:
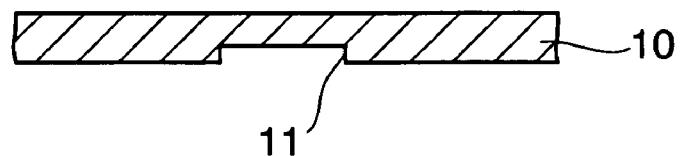
Figure 10:
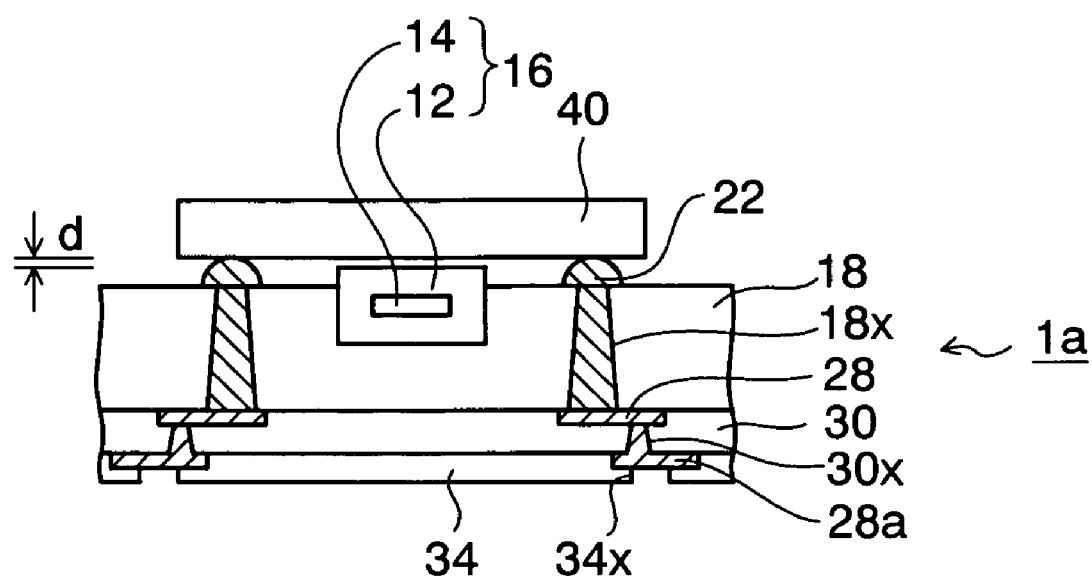
FIG. 10 is a partial sectional view showing the situation that an optical device is mounted on the optoelectric composite substrate according to the second embodiment of the present invention.

In the method of manufacturing the optoelectric composite substrate in the second embodiment, as shown in FIG. 9A, first the copper foil 10 serving as the temporal substrate is prepared, like the first embodiment. Then, as shown in FIG. 9B, in the second embodiment, a recess portion 11 is formed in a predetermined portion of the copper foil 10. This recess portion 11 is formed by the photolithography and the etching, for example. This recess portion 11 is formed so as to adjust the distance between the optical device and the optical waveguide by setting the upper surface of the optical waveguide 16 higher than the upper surface of the insulating film 18 in the first embodiment. For this reason, a width and a length of the recess portion 11 are set to correspond to a width and a length of the optical waveguide 16, and then a depth of the recess portion 11 is set lower than the height of the connection terminals connected later.

Figure 9C:
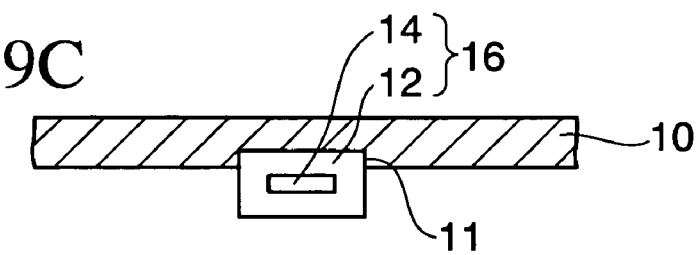

Then, as shown in FIG. 9C, the optical waveguide 16 having such a structure that the core portion 14 is surrounded by the cladding portion 12 is formed on the recess portion 11 of the copper foil 10 by the similar method to the first embodiment. Thus, the optical waveguide 16 is formed in a state that a part of the optical waveguide is fitted into the recess portion 11.

Figure 9D:
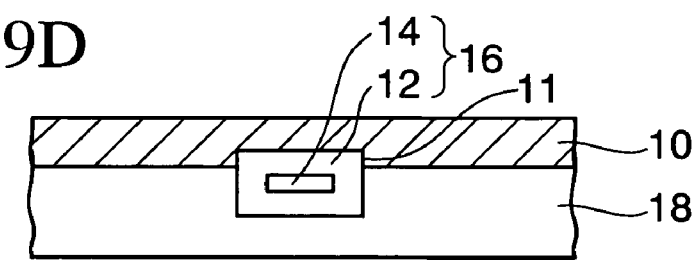
Figure 9E:
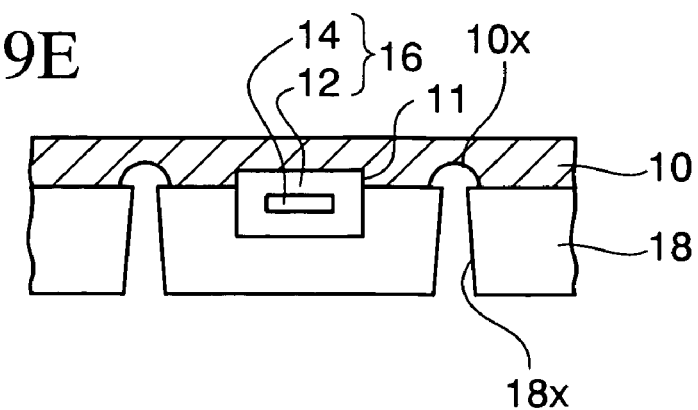

Then, as shown in FIGS. 9D and 9E, according to the same steps as the first embodiment, the insulating film 18 for covering the optical waveguide 16 is formed, then the first via holes 18x are formed in the predetermined portions of the insulating film 18, and then the concave portions 10x are formed in the portions of the copper foil 10, which are exposed from bottom surfaces of the first via holes 18x.

Figure 9F:
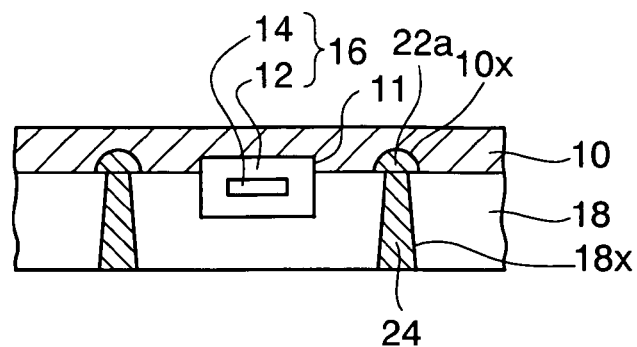

Then, as shown in FIG. 9F, according of the same steps as the first embodiment, the metal layer 22a is formed in the concave portions 10x of the copper foil 10 and then the conductor 24 connected to the metal layers 22a is filled in the first via holes 18x.

Figure 9G:
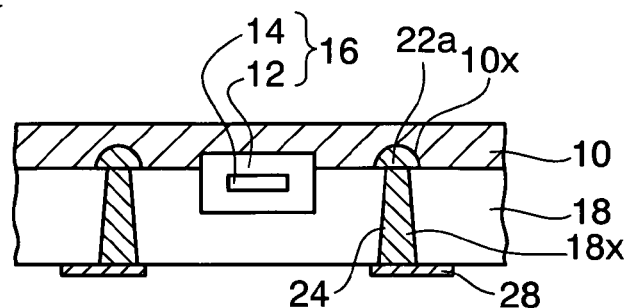
Figure 9H:
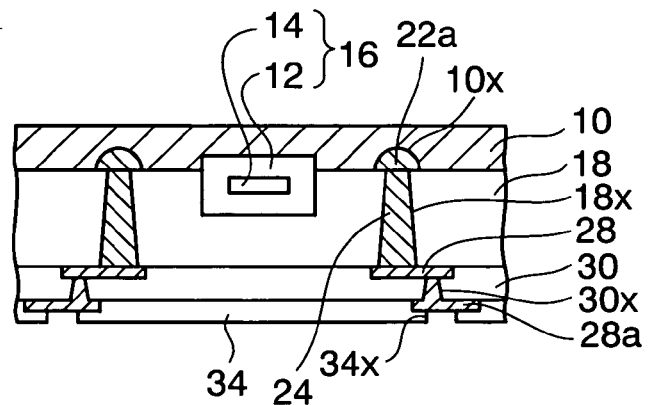

Then, as shown in FIG. 9G, the first wiring layers 28 connected to the conductors 24 are formed on (the lower surface of) the insulating film 18 by the same steps as the first embodiment. Then, as shown in FIG. 9H, the second wiring layers 28a connected to the first wiring layers 28 via the second via holes 30x provided in the interlayer insulating film 30 are formed on the interlayer insulating film 30. Then, the protection layer 34 in which the opening portions 34x are provided on the second wiring layers 28a is formed.

Figure 9I:
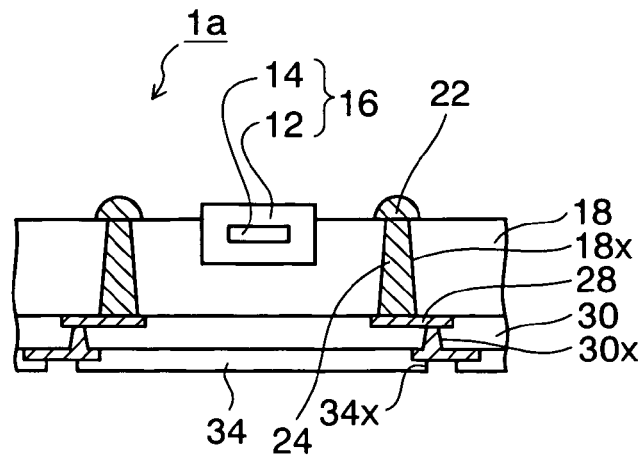

Then, the copper foil 10 is removed by selectively releasing from a resultant structure in FIG. 9H. Accordingly, as shown in FIG. 9I, the metal layers 22a are exposed like the first embodiment and thus the connection terminals 22 are obtained, and also the upper portions of the optical waveguide 16 and the insulating film 18 are exposed. With the above, an optoelectric composite substrate 1a in the second embodiment can be obtained. Then, as shown in FIG. 10, the connection electrodes of the optical device 40 are connected to the connection terminals 22 of the optoelectric composite substrate 1a. Since the optoelectric composite substrate 1a in the second embodiment is identical to the optoelectric composite substrate 1 in the first embodiment except that the optical waveguide 16 is protruded from the upper surface of the insulating film 18, remaining explanation will be omitted herein.

In the second embodiment, since the optical waveguide 16 is formed in such a manner than a part thereof is fitted in the recess portion 11 of the copper foil 10, the upper surface of the optical waveguide 16 is positioned higher than the upper surface of the insulating film 18 by the depth of the recess portion 11 of the copper foil 10. Thus, the distance d between the optical device 40 and the optical waveguide 16 is given by subtracting the projection height of the optical waveguide 16 from the insulating film 18 from the height of the connection terminals 22. Therefore, the projection height of the optical waveguide 16 is set lower than the height of the connection terminals 22.

In this fashion, in the second embodiment, even in the case where the connection terminals 22 are formed to have the same height as that in the first embodiment, the distance d between the optical device 40 and the optical waveguide 16 can be set shorter that that in the first embodiment by projecting the optical waveguide 16 from the upper surface of the insulating film 18.

In the first embodiment, in case the optical device 40 can be arranged in close vicinity to the optical waveguide 16 up to the limit to such an extent that they do not come into contact with each other, the distance between them is adjusted only by the height of the connection terminals 22. As a result, it is supposed that such disadvantages are caused that the area of the connection terminal 22 cannot be sufficiently assured.

On the contrary, in the second embodiment, when the height of the connection terminals 22 should be sufficiently assured, the optical device 40 and the optical waveguide 16 are arranged closely to such an extent that they do not come into contact with each other, by projecting the optical waveguide 16 from the insulating film 18. Therefore, in case the optical device 40 and the optical waveguide 16 are arranged closely to the limit, the optical device 40 can be jointed to the connection terminals 22 with good reliability.

As described above, the second embodiment can achieve the same advantages as the first embodiment and also the second embodiment is convenient for the case where the optical device 40 can be positioned in close vicinity to the optical waveguide 16 up to the limit.

Next, an example of the case where the optoelectric composite substrate 1a constructed basically as above is applied to an MCM (Multi-Chip Module) substrate having the optical waveguides will be explained hereunder.

Figure 11:
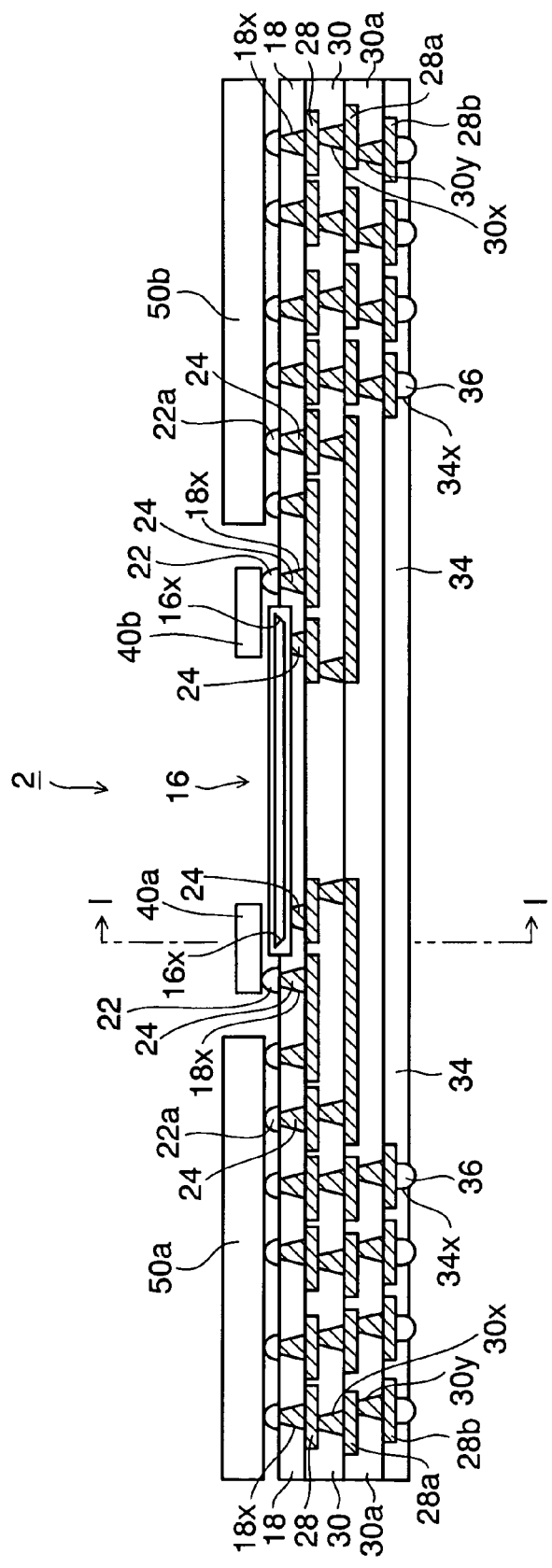
FIG. 11 is a sectional view showing an example of the case where the optoelectric composite substrate according to the second embodiment of the present invention is applied to an MCM substrate.

FIG. 11 is a sectional view showing an example of the case where the optoelectric composite substrate according to the second embodiment of the present invention is applied to the MCM substrate having the optical waveguide. In this case, above FIG. 10 is a schematic view corresponding to a cross section taken along a I-I line in FIG. 11, but contains portions that are different from FIG. 11.

As shown in FIG. 11, in an MCM substrate 2 to which the optoelectric composite substrate 1a in the present embodiment is applied, the first via holes 18x are provided in the insulating film 18 and the conductor 24 is filled in the first via holes 18x. Then, the connection terminals 22 projected at a predetermined height from the upper surface of the insulating film 18 are connected to the upper surfaces of the conductors 24. Then, the optical waveguide 16 is buried in the insulating film 18 in a state that the optical waveguide 16 is projected from the upper surface of an insulating film 18 at a height that is lower than the height of the connection terminals 22. An optical-path converting portion 16x for converting the optical path by 90 is provided to both end portions of the optical waveguide 16.

Then, a light emitting element 40a is connected to the connection terminal 22 that is located in vicinity of one end side of the optical waveguide 16, and a photodetector 40b is connected to the connection terminal 22 that is located in vicinity of the other end side of the optical waveguide 16. As the light emitting element 40a, preferably the surface emitting laser (VCSEL: Vertical Cavity Surface Emitting Laser) is used.

In this manner, the light emitting element 40a and the photodetector 40b are mounted over the optical-path converting portion 16x on both end sides of the optical waveguide 16 respectively. For the above reason, the light emitting element 40a and the photodetector 40b can be mounted closely up to the distance in such an extent that they do not come in touch with the optical waveguide 16.

Connection terminals 22a formed similarly to the connection terminals 22 that are connected to the light emitting element 40a and the photodetector 40b are provided to the areas located laterally near the light emitting element 40a and the photodetector 40b, and are connected to the conductors 24. Electrodes of a first LSI chip 50a are connected to the connection terminals 22a that are located laterally near the light emitting element 40a, and electrodes of a second LSI chip 50b are connected to the connection terminals 22a that are located laterally near the photodetector 40b.

In this case, in the example in FIG. 11, the light emitting element 40a and the photodetector 40b and the LSI chips 50a, 50b are connected to the connection terminals 22, 22a having the same structure respectively. But such a mode may be employed that bumps are provided to the LSI chips 50a, 50b and then the bumps are connected to connection terminals that are not projected from the insulating film 18 (see a third embodiment). In other words, different connection systems may be applied between the light emitting element 40a and the photodetector 40b, and the LSI chips 50a, 50b.

Also, the first wiring layers 28 are formed on the lower surfaces of the conductors 24 and connected thereto, and the second and third wiring layers 28a, 28b are formed via the interlayer insulating films 30, 30a respectively. The first, second, and third wiring layers 28, 28a, 28b are mutually connected via the second and third via holes 30x, 30y provided in the interlayer insulating films 30, 30a. In addition, the protection layer 34 in which the opening portions 34x are provided on the lowermost third wiring layer 28b is formed on the lower surface of the interlayer insulating film 30a, and external connection terminals 36 such as solder balls, lead pins, or the like, which are connected to the third wiring layers 28b, are provided in the opening portions 34x. In this event, a mode in which three-layered build-up wiring layer is provided is illustrated, but a mode in which n-layered (n is an integer that is 1 or more) build-up wiring layer is provided may be employed.

The first LSI chip 50a is connected electrically to the light emitting element 40a via the connection terminals 22a, the conductors 24, the first and second wiring layers 28, 28a, the conductors 24, and tile connection terminals 22. Also, the photodetector 40b is connected electrically to the second LSI chip 50b via the connection terminals 22, the conductors 24, the first and second wiring layers 28, 28a, the conductors 24, and the connection terminals 22a.

In the MCM substrate 2 constructed in this manner, the electric signal output from the first LSI chip 50a is supplied to the light emitting element 40a via the first and second wiring layers 28, 28a, and others, then the light emitting element 40a converts the electric signal into the light signal, and then the light signal is incident on the light incident portion of the optical waveguide 16 and then the optical path is turned by 90 by the optical-path converting portion 16x. Then, the light incident on the core portion 14 propagates by repeating the total reflection in the core portion 14, and then is incident on the light detection surface of the photodetector 40b via the optical-path converting portion 16x provided to the other end side. The photodetector. 40b converts the light signal into the electric signal, and then the electric signal is supplied to the second LSI chip 50b via the first and second wiring layers 28, 28a, and others.

As the combination of the first LSI chip 50a and the second LSI chip 50b, there are the CPU and the chip set, the CPU and the memory, and the like, for example. Such LSI chips 50a, 50b are mounted on one substrate and then connected mutually by the optical interconnection. Thus, the MCM substrate 2 is constructed. Then, the external connection terminals 36 of the MCM substrate 2 are mounted on the circuit board (mother board).

In recent years, the MCM substrate a throughput of which exceeds several tens Gbit/s, for example, is realized with the progress of the CMOS technology, but it is possible that electrical inputting/outputting reach the limit in respects of the terminal density and the transmission rate. In the present embodiment, a great amount of data can be transmitted at a high speed without noise since the transmission between the first and second LSI chips 50a, 50b is performed via the optical waveguide 16.

Also, in the present embodiment, the optical device can be arranged in close vicinity to the optical waveguide not to contact to it, and also the optical device can be aligned with the optical waveguide with high precision. Therefore, the good optical coupling characteristics can be attained, and the performance of the MCM substrate 2 in which the optical waveguide 16 is built can be improved.

In addition, the predetermined build-up wiring layer can be formed below the optical waveguide 16 in a series of production processes. Therefore, the present embodiment can responds easily to the high-performance LSI chip packaging substrate.

Figure 12:
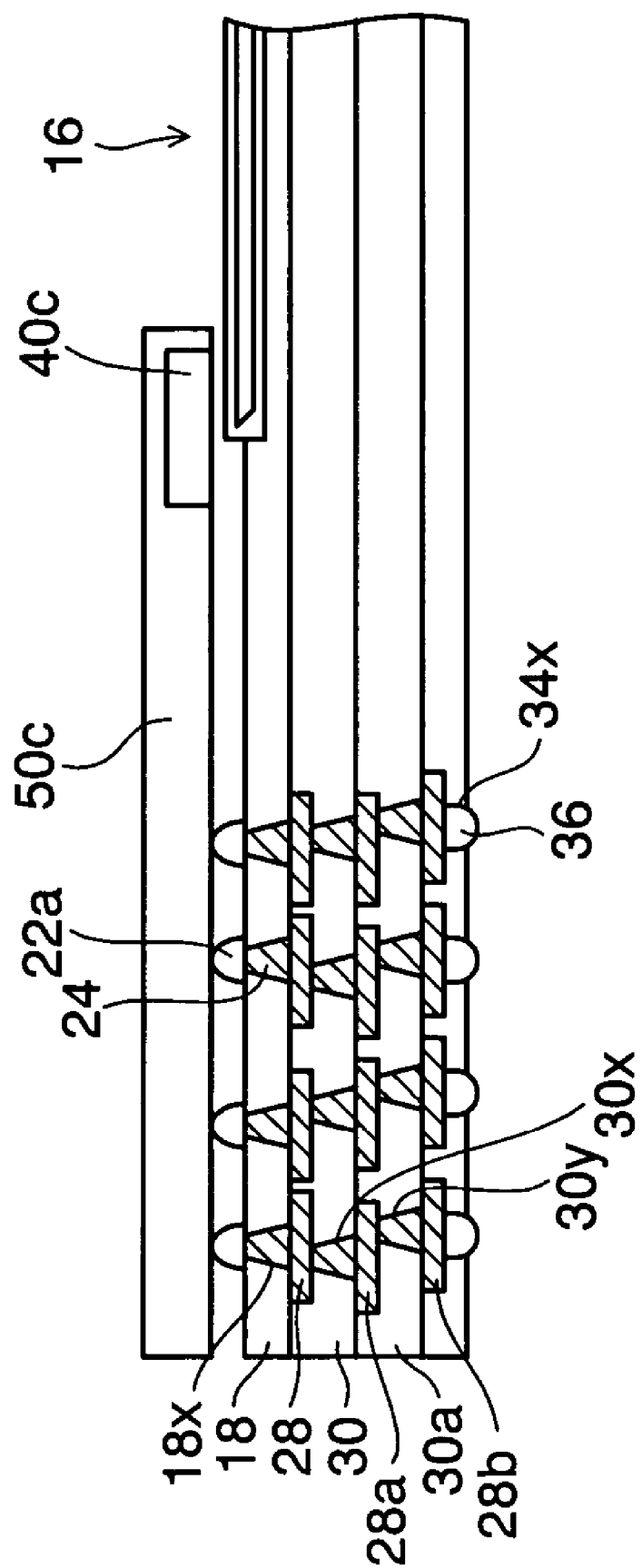
FIG. 12 is a sectional view showing a variation of the case where the optoelectric composite substrate according to the second embodiment of the present invention is applied to an MCM substrate.

Next, a variation of the case where the optoelectric composite substrate in the second embodiment is applied to the MCM substrate in which the optical waveguide is built will be explained hereunder. FIG. 12 is a sectional view showing a variation of the case where the optoelectric composite substrate according to the second embodiment of the present invention is applied to the MCM substrate having the optical waveguide.

In the present variation, the chip having a light emitting function is used as the first LSI chip 50a in FIG. 11. In FIG. 12, an optical hybrid LSI chip 50c in which a light emitting portion 40c is built is illustrated, and the light emitting portion 40c is built in the LSI chip 50c such that its light emitting surface (lower surface) and a lower surface of the LSI chip 50c constitute a coplanar surface.

Then, the similar connection terminals 22a are formed on the conductors 24 in the area on which the optical hybrid LSI chip 50c is mounted, and electrodes of the optical hybrid LSI chip 50c are connected to the connection terminals 22a.

With this arrangement, a distance between the light emitting portion 40c of the optical hybrid LSI chip 50c and the optical waveguide 16 can be adjusted similarly. Also, although not shown, the chip having the similar configuration to the above optical hybrid LSI chip 50c may be mounted by using a chip that has a light detection function on its lower surface side as the second LSI chip 50b in FIG. 11. Since other elements in FIG. 12 are identical to those in FIG. 11, their explanation will be omitted herein by affixing the same reference symbols.

Here, a mode in which the optoelectric composite substrate 1a in the present embodiment is applied to the MCM substrate is illustrated. But it is needless to say that the electric wirings in various circuit boards such as the printed-circuit board, or the like may be replaced with the optical waveguide respectively in application.

Also, the light emitting element of the type that a plurality of light emitting surfaces are arranged like an array and single or plural lights are irradiated at predetermined timings may be used as the light emitting element 40a.

Further, the optoelectric composite substrate 1 in the first embodiment can be applied similarly to the MCM substrate, or the like.

Third Embodiment

FIGS. 13A to 13D are partial sectional views showing a method of manufacturing an optoelectric composite substrate according to a third embodiment of the present invention. FIG. 14 is a partial sectional view showing the situation that the optical device is mounted on the same optoelectric composite substrate.

A feature of the third embodiment resides in that the connection terminals are embedded in the upper-side portions of the via holes such that their upper surfaces and the upper surface of the insulating film constitute a coplanar surface, and the distance between the optical device and the optical waveguide is adjusted based on a height of bumps provided to the optical device. The same reference symbols are affixed to the same elements as those in the first and second embodiments, and their explanation will be omitted herein.

Figure 13A:
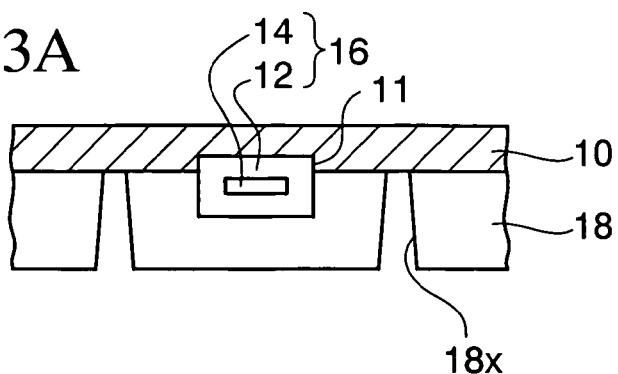
FIGS. 13A to 13D are partial sectional views showing a method of manufacturing an optoelectric composite substrate according to a third embodiment of the present invention.
Figure 14:
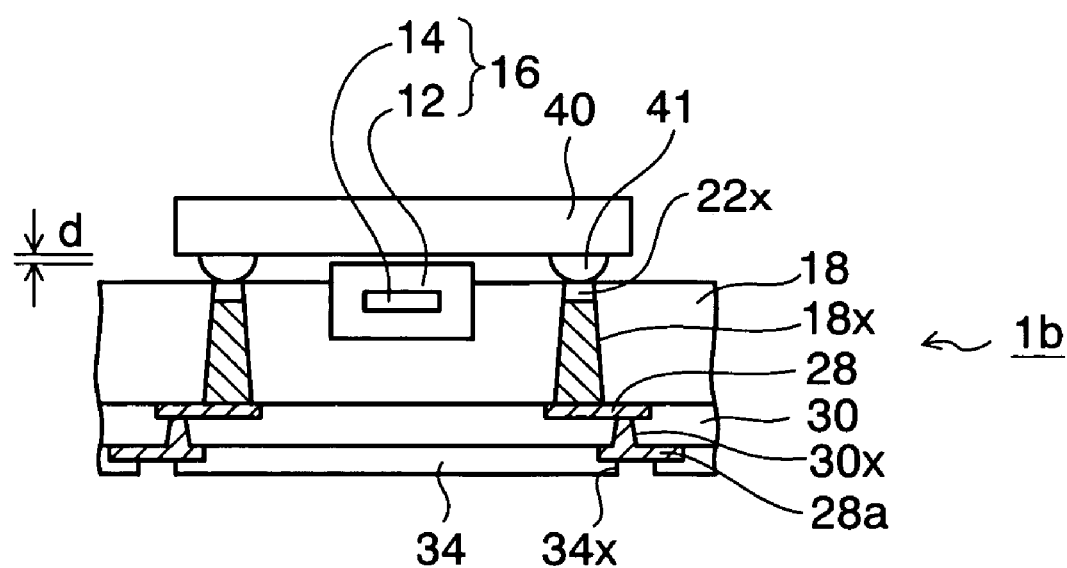
FIG. 14 is a partial sectional view showing the situation that an optical device is mounted on a first optoelectric composite substrate according to the third embodiment of the present invention.

In the method of manufacturing the optoelectric composite substrate according to the third embodiment, as shown in FIG. 13A, according to the similar method to the second embodiment, first the structure similar to the above structure shown in FIG. 9D and then the first via holes 18x are formed in the predetermined portions of the insulating film 18. In the third embodiment, unlike the first and second embodiments, the concave portion 10x is not formed in portions of the copper foil 10, which are exposed from the bottom portions of the first via holes 18x. In this case, the recess portion 11 is not formed in the copper foil 10 when the upper surface of the optical waveguide 16 and the upper surface of the insulating film 18 are formed to constitute the coplanar surface.

Figure 13B:
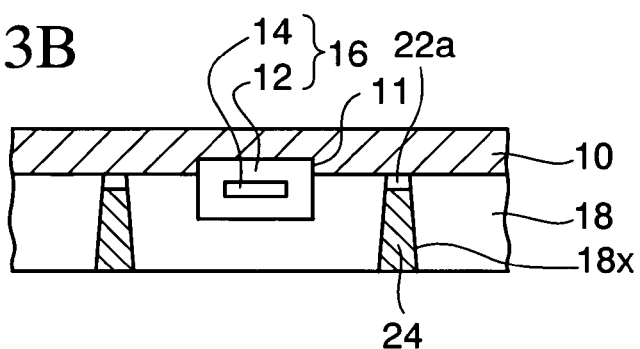

Then, as shown in FIG. 13B, the metal layers 22a are formed on the bottom portions of the first via holes 18x by the electroplating. As the metal layers 22a, a gold layer and a nickel layer are formed sequentially, alternatively a gold layer, a palladium layer and a nickel layer are formed sequentially. Then, the conductors 24 connected to the metal layers 22a are filled in the first via holes 18x.

Figure 13C:
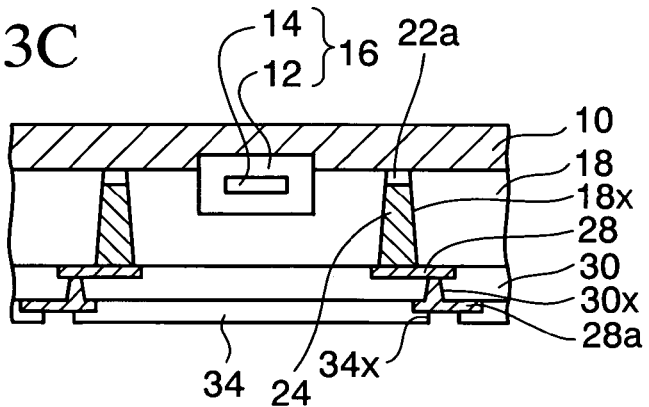

Then, as shown in FIG. 13C, according to the similar method to the first embodiment, the first wiring layers 28 connected to the lower surfaces of the conductors 24 are formed on the lower surface of the insulating film 18, and then the second wiring layers 28a connected to the first wiring layers 28 via the second via holes 30x in the interlayer insulating film 30 are formed. Then, the protection layer 34 in which the opening portions 34x are provided on the second wiring layers 28a is formed.

Figure 13D:
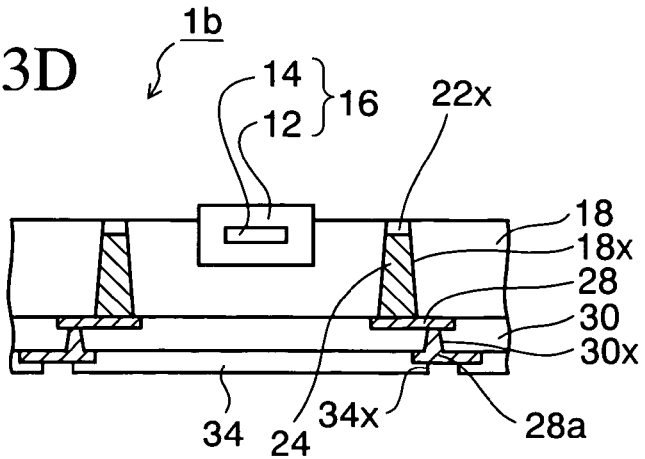

Then, as shown in FIG. 13D, the copper foil 10 is removed from the resultant structure in FIG. 13C. Thus, the upper surfaces of the metal layers 22a, the optical waveguide 16, and the insulating film 18 are exposed, and thus the metal layers 22a are formed as connection terminals 22x. As a result, a first optoelectric composite substrate 1b in the third embodiment is obtained.

In the first optoelectric composite substrate 1b in the third embodiment, the connection terminals 22x are embedded in the upper-side portions of the first via holes 18x and connected to the conductors 24 such that the upper surfaces of the connection terminals 22x provide the same flat surface as the upper surface of the insulating film. Also, the optical waveguide 16 is embedded in the insulating film 18 to project from the upper surface of the insulating film 18.

Then, as shown in FIG. 14, the optical device 40 on which bumps 41 made of solder, gold, or the like are formed is prepared. Then, the light emitting surface or the light detection surface of the optical device 40 is faced to the desired portion of the optical waveguide 16, and then the bumps 41 of the optical device 40 are flip-chip mounted on the connection terminals 22x and connected electrically thereto.

In the third embodiment, the distance d between the optical device 40 and the optical waveguide 16 is given by subtracting a projection height of the optical waveguide 16 from the insulating film 18 from a height of the bumps 41 of the optical device 40. Therefore, the projection height of the optical waveguide 16 is set lower than the height of the bumps 41 of the optical device 40.

Figure 15:
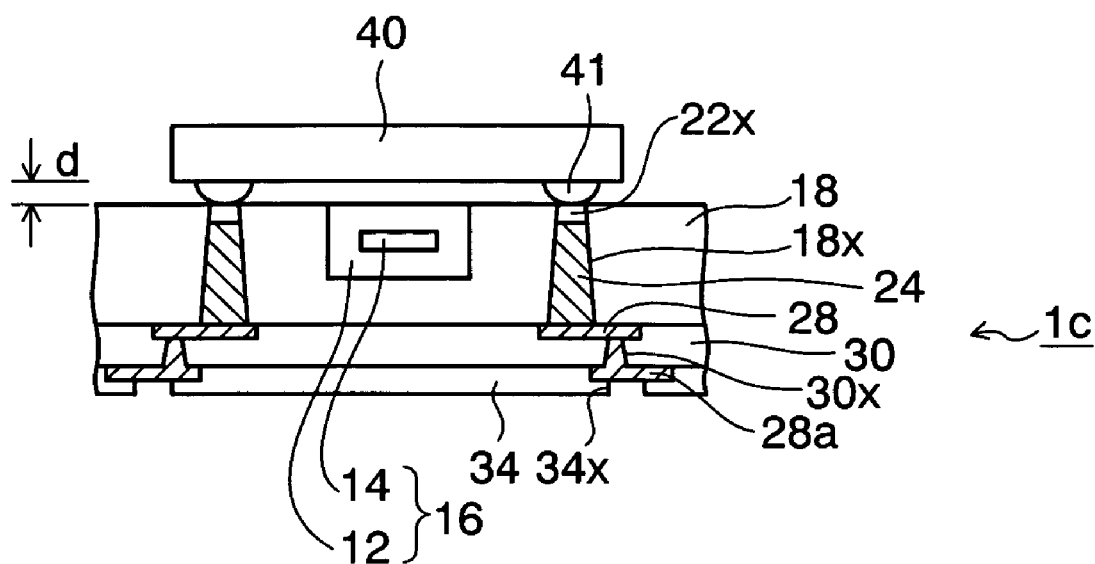
FIG. 15 is a partial sectional view showing the situation that an optical device is mounted on a second optoelectric composite substrate according to the third embodiment of the present invention.

Also, in case the recess portion 11 is not formed in the copper foil 10 in FIG. 13A, the upper surfaces of the connection terminals 22x, the optical waveguide 16, and the insulating film 18 constitute the identical flat surface, as shown in FIG. 15. Thus, a second optoelectric composite substrate 1c in the third embodiment is given. Then, the bumps 41 of the optical device 40 are flip-chip mounted on the connection terminals 22x and connected electrically thereto. In the second optoelectric composite substrate 1c, the distance between the optical device 40 and the optical waveguide 16 is adjusted only by the height of the bumps 41 of the optical device 40.

In the third embodiment, the optical device 40 can be aligned with the optical waveguide 16 with good precision and also the optical device 40 can be arranged in close vicinity to the optical waveguide 16 not to touch it. As a result, the third embodiment can achieve the similar advantages to the first and second embodiments.

Figure 16:
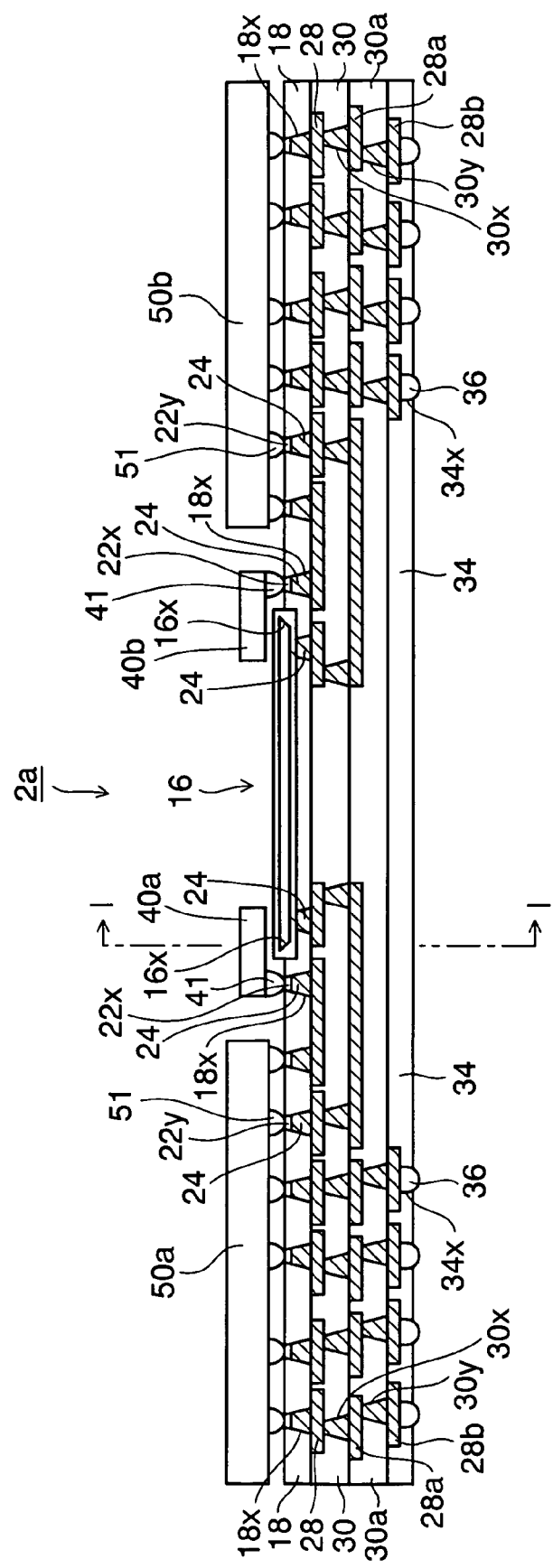
FIG. 16 is a sectional view showing an example of the case where the first optoelectric composite substrate according to the third embodiment of the present invention is applied to the MCM substrate.

Next, an example of the case where the first optoelectric composite substrate 1b in the third embodiment is applied to the MCM substrate will be explained hereunder. FIG. 16 is a sectional view showing an example of the case where the first optoelectric composite substrate according to the third embodiment of the present invention is applied to the MCM substrate.

As shown in FIG. 16, in an MCM substrate 2a to which the first optoelectric composite substrate 1b in the third embodiment is applied, the connection terminal 22x is embedded in the upper-side portions of the first via holes 18x provided in the insulating film 18, and the conductor 24 is filled in the lower-side portions of the first via holes 18x. As described above, the connection terminals 22x are provided in a state that their upper surfaces as well as the upper surface constitute the coplanar surface. Also, the optical waveguide 16 is embedded in the insulating film 18 in a condition that such optical waveguide is projected from the upper surface of the insulating film 18 at a predetermined height. Then, the bumps 41 of the light emitting element 40a are connected to the connection terminals 22x near one end side of the optical waveguide 16, and also the bumps 41 of the photodetector 40b are connected to the connection terminals 22x near the other end side of the optical waveguide 16.

In this fashion, the light emitting element 40a and the photodetector 40b are mounted over the optical-path converting portions 16x on both end sides of the optical waveguide 16 respectively. Respective distances between the light emitting element 40a and the photodetector 40b and the optical waveguide 16 are adjusted by the height of the bumps 41 provided thereto and the projection height of the optical waveguide 16.

Connection terminals 22y that are formed similarly to the above connection terminals 22x are buried in the upper-side portion of the first via holes 18x in the insulating film 18 in respective neighboring areas of the light emitting element 40a and the photodetector 40b. Bumps 51 of the first LSI chip 50a are connected to the connection terminals 22y located laterally near the light emitting element 40a, and also the bumps 51 of the second LSI chip 50b are connected to the connection terminals 22y located laterally near the photodetector 40b.

Here, in the example in FIG. 16, the bumps 41 of the light emitting element 40a and the photodetector 40b and the bumps 51 of the LSI chips 50a, 50b are connected to the connection terminals 22x, 22y, which are not projected from the insulating film 18, respectively. But the bumps 51 are not provided to the LSI chips 50a, 50b and then the electrodes of the LSI chips 50a, 50b may be connected to the connection terminals that are projected from the insulating film 18 (second embodiment).

The MCM substrate 2a according to the third embodiment can operate similarly to the MCM substrate 2 according to the second embodiment, and can achieve the similar advantages to the second embodiment.

The second optoelectric composite substrate 1c in the third embodiment can be applied similarly to the MCM substrate, or the like.

What is claimed is:

1. A method of manufacturing an optoelectric composite substrate, comprising the steps of:
    forming an optical waveguide on a temporal substrate;
    forming an insulating film on the temporal substrate to cover the optical waveguide;
    forming a via hole to pass through the insulating film;
    forming sequentially a metal layer and a conductor in the via hole; and
    removing selectively the temporal substrate to expose surfaces of the metal layer, the optical waveguide, and the insulating film, whereby a connection terminal made of the metal layer is obtained.

2. A method of manufacturing an optoelectric composite substrate according to claim 1, wherein the step of forming the via hole includes the step of forming a concave portion, which is communicated with the via hole, in the temporal substrate, and the via hole is constructed to include the concave portion,
    the step of forming sequentially the metal layer and the conductor in the via hole includes the step of forming the metal layer in a concave portion of the temporal substrate, and
    the connection terminal made of the metal layer that is projected from an upper surface of the insulating film at a predetermined height is obtained in the step of obtaining the connection terminal.

3. A method of manufacturing an optoelectric composite substrate according to claim 1, wherein the step of forming the optical waveguide on the temporal substrate includes the steps of,
    forming a recess portion, which corresponds to a width of the optical waveguide, in the temporal substrate, and
    forming the optical waveguide by fitting a part of the optical waveguide into the recess portion.

4. A method of manufacturing an optoelectric composite substrate according to claim 1, further comprising the step of forming an n-layered (n is an integer that is 1 or more) wiring layer, that is connected to the conductor, on an opposite surface side of the insulating film to a surface on the metal layer side, before or after the step of removing selectively the temporal substrate.

5. A method of manufacturing an optoelectric composite substrate according to claim 1, further comprising the step of connecting the optical device to the connection terminal in a state that a light emitting surface or a light detection surface of the optical device is opposed to a predetermined portion of the optical waveguide, after the step of removing the temporal substrate.

6. A method of manufacturing an optoelectric composite substrate according to claim 1, wherein the temporal substrate is formed of a conductive metal, and
    the metal layer and the conductor are formed respectively by an electroplating utilizing the temporal substrate as a power-feeding layer, in the step of forming the metal layer and the conductor in the via hole.

7. A method of manufacturing an optoelectric composite substrate according to claim 6, wherein the temporal substrate is a copper foil, the metal layer is made of solder or gold, and the conductor is made of copper.

8. A method of manufacturing an optoelectric composite substrate according to claim 1, wherein the step of forming the optical waveguide on the temporal substrate includes the steps of,
    forming a first cladding layer on the temporal substrate,
    forming a core layer, a refractive index of which is higher than a refractive index of the first cladding layer, on the first cladding layer,
    patterning the core layer to get the core portion,
    forming a second cladding layer, which is made of a same material as the first cladding layer, on the first cladding layer and the core portion, and
    patterning the second cladding layer and the first cladding layer to get the optical waveguide.

* * * * *